United States Patent [19]
Ko

[11] Patent Number: 5,650,735
[45] Date of Patent: Jul. 22, 1997

[54] LOW POWER, HIGH PERFORMANCE LATCHING INTERFACES FOR CONVERTING DYNAMIC INPUTS INTO STATIC OUTPUTS

[75] Inventor: Uming Ko, Plano, Tex.

[73] Assignee: Texas Instruments Incorporated, Dallas, Tex.

[21] Appl. No.: 410,463

[22] Filed: Mar. 24, 1995

[51] Int. Cl.$^6$ .................... H03K 19/00; H03K 19/096
[52] U.S. Cl. .................. 326/93; 326/95; 327/203; 327/211
[58] Field of Search .............. 326/83, 93, 95; 327/203, 211

[56] References Cited

U.S. PATENT DOCUMENTS

| | | | |
|---|---|---|---|
| 4,914,318 | 4/1990 | Allen | 326/46 |
| 5,025,174 | 6/1991 | Shikata | 327/203 |
| 5,257,223 | 10/1993 | Dervisoglu | 327/203 |
| 5,426,380 | 6/1995 | Rogers | 327/211 |

*Primary Examiner*—Edward P. Westin
*Assistant Examiner*—Richard Roseen
*Attorney, Agent, or Firm*—Scott B. Stahl; Leo N. Heiting; Richard L. Donaldson

[57] ABSTRACT

A circuit (51) for converting a pair of precharged dynamic logic signals into a static logic signal includes a first input (61) to receive one of said dynamic logic signals, a second input (67) to receive the other of said dynamic logic signals, and an output (Qout). A first signal path from said first input to said output includes only two logic gates (63,69), and a second signal path from said second input to said output includes only one logic gate (69).

22 Claims, 2 Drawing Sheets

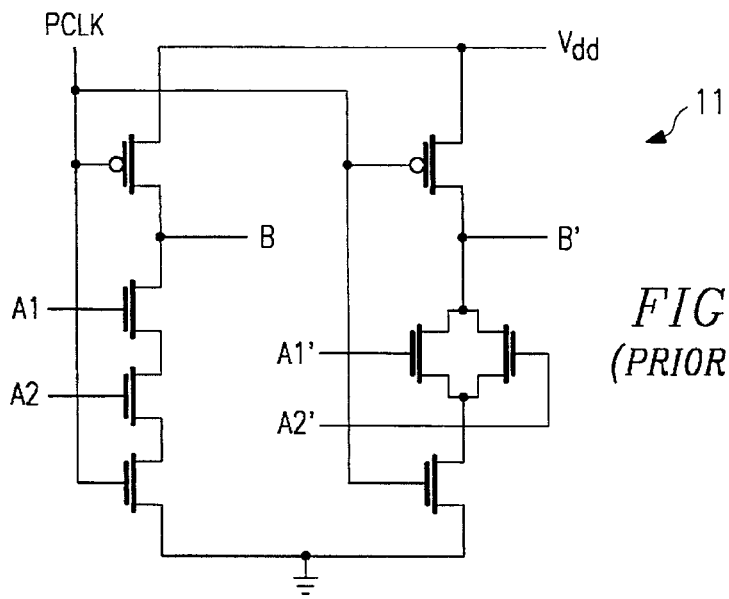
FIG. 1
(PRIOR ART)
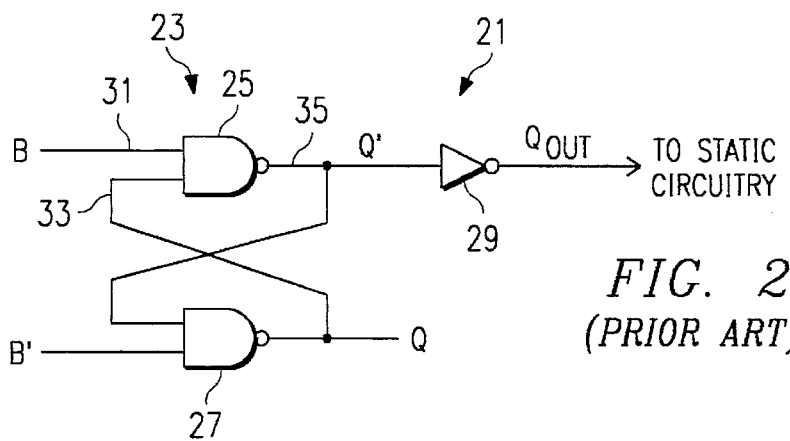
FIG. 2
(PRIOR ART)
| B | B' | Q | Q' |
|---|----|---|----|
| 0 | 1  | 0 | 1  |
| 1 | 0  | 1 | 0  |
| 1 | 1  | NO CHANGE ||
FIG. 3
(PRIOR ART)
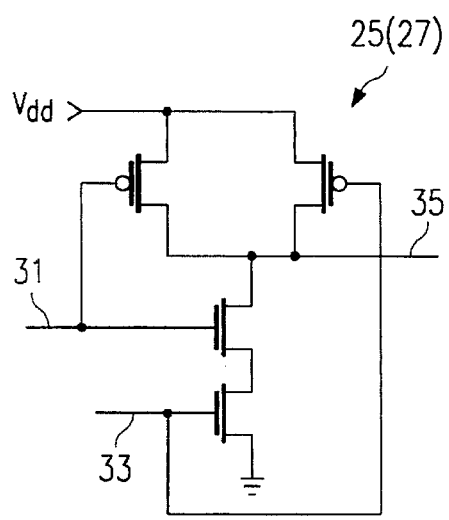
FIG. 4
(PRIOR ART)

LOW POWER, HIGH PERFORMANCE LATCHING INTERFACES FOR CONVERTING DYNAMIC INPUTS INTO STATIC OUTPUTS

FIELD OF THE INVENTION

The invention relates generally to interfacing between dynamic circuitry and static circuitry and, more particularly, to low power, high performance latching interfaces.

BACKGROUND OF THE INVENTION

FIG. 1 illustrates a conventional dynamic NAND gate 11 wherein the complementary outputs B and B' are precharged to logic 1 on the falling edge of a precharge dock PCLK and wherein, on the rising edge of PCLK, one of the complementary outputs remains at logic 1 and the other begins to fall to logic 0, depending on the logic state of logic inputs A1, A2, A1' and A2'. Such precharged, complementary outputs are produced in dynamic circuitry like dual-rail domino circuitry, and are also produced by the sense amplifiers of conventional memory circuitry such as SRAM circuitry. When interfacing between dynamic output signals such as shown in FIG. 1 and static circuitry which requires a static logic signal input, it is desirable to provide an interface which is both fast and energy-efficient.

FIG. 2 illustrates a conventional interface 21 which converts precharged dynamic signals such as B and B' into a static logic signal $Q_{out}$ which is then applied to an input of a static circuit. FIG. 3 illustrates the truth table for the latch circuit 23 of FIG. 2, which latch circuit 23 includes NAND gates 25 and 27. The possible logic states of signals B and B' are shown on the left side of the FIG. 3 truth table, and the corresponding logic states of signals Q and Q' are shown on the right side of the FIG. 3 truth table. When the logic state of signals B and B' changes from 0 and 1, respectively, through the precharged state of 1 and 1, to the logic state of 1 and 0, respectively, the final transition of B' from 1 to 0 must propagate through 3 logic gates, namely NAND gate 27, NAND gate 25 and inverter 29, before $Q_{out}$ transitions from 0 to 1 as desired. When the logic state of signals B and B' transitions from 1 and 0, respectively, through the precharged state of 1 and 1, to the logic state of 0 and 1, respectively, the final transition of B from 1 to 0 must propagate through 2 logic gates, namely NAND gate 25 and inverter 29 before $Q_{out}$ transitions from 1 to 0 as desired.

The gate length of all transistors described herein is 0.6 micron unless otherwise stated.

The conventional NAND gate transistor design of FIG. 4 is typically used for NAND gates 25 and 27 of FIG. 2. The inputs 31 and 33 of NAND gate 25, and the output 35 of NAND gate 25 are designated in the transistor diagram of FIG. 4. Assuming that: the n-channel transistors of NAND gates 25 and 27 have a 9 micron gate width and the p-channel transistors of NAND gates 25 and 27 have a 19 micron gate width; the n-channel transistor of inverter 29 has a 21 micron gate width and the p-channel transistor of inverter 29 has a 34.5 micron gate width; and a 0.3 pf load is connected to $Q_{out}$; the average propagation delay through interface 21 (sometimes through 3 logic gates and sometimes through 2 logic gates as discussed above) is 411 ps. The stacked arrangement of the n-channel transistors of FIG. 4 requires these transistors to have a relatively wide gate width of 9 microns in order to achieve the aforementioned average propagation delay. However, the relatively large n-channel transistors add more input capacitance, disadvantageously resulting in a relatively high average power dissipation of 0.428 mW.

The present invention provides interface circuitry which converts a precharged dynamic logic signal to a static logic signal with a lower average propagation delay and a lower average power dissipation than the prior art arrangement.

BRIEF DESCRIPTION OF THE DRAWINGS

FIG. 1 illustrates a conventional dynamic NAND gate design.

FIG. 2 illustrates a conventional circuit for interfacing between dynamic and static signals.

FIG. 3 illustrates a truth table associated with the latch circuit of FIG. 2.

FIG. 4 is a transistor diagram of the NAND gates of FIG. 2.

DETAILED DESCRIPTION OF THE INVENTION

Figure 5:
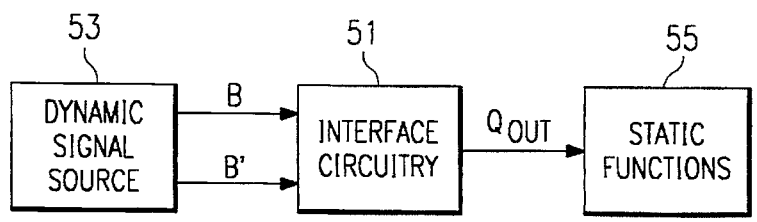
FIG. 5 is a block diagram illustrating the interface circuitry of the present invention connected to receive a precharged dynamic logic input and produce a static logic output.

FIG. 5 is a block diagram illustrating interface circuitry 51 according to the present invention connected to a dynamic signal source 53 to receive a precharged dynamic logic signal B and B' therefrom, and connected to static circuitry at 55 to provide thereto a static logic signal $Q_{out}$. The dynamic signal source 53 may be, for example, dual-rail domino circuitry, or any other type of dynamic circuitry that provides complementary, precharged outputs. The dynamic signal source 53 may also be sense amplifier circuitry of a memory circuit such as an SRAM, which sense amplifier circuitry typically provides complementary, precharged data bits from the memory circuit.

Figure 6:
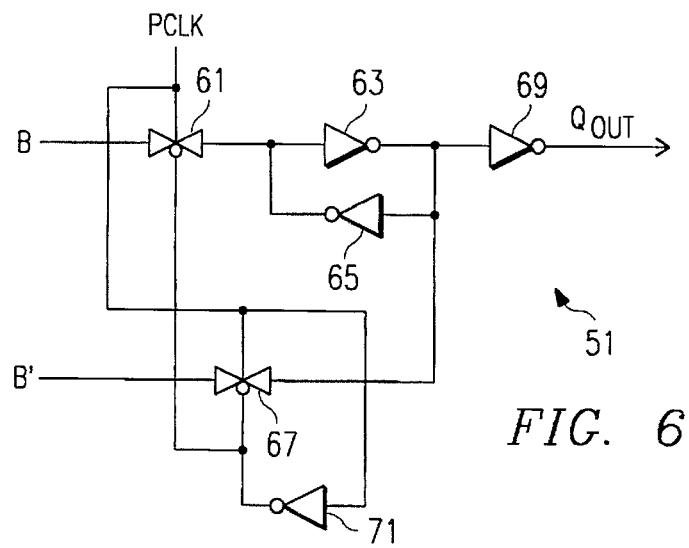
FIG. 6 illustrates one exemplary embodiment of the interface circuitry of FIG. 5.

FIG. 6 illustrates one exemplary embodiment of the interface circuitry 51 of FIG. 5. In FIG. 6, B is connected to the input of a transmission gate 61 whose output is connected to a pair of cross-coupled inverters 63 and 65. B' is connected to the input of a transmission gate 67 whose output is connected to cross-coupled inverters 63 and 65 opposite the output of transmission gate 61. The output of transmission gate 67 and the output of inverter 63 are connected to the input of inverter 65 and also to the input of inverter 69. The output of transmission gate 61 is connected to the input of inverter 63 and also to the output of inverter 65. Inverter 71 is provided to invert the precharge dock PCLK. The inverted PCLK output of inverter 71 is connected to the gates of the p-channel transistors of transmission gates 61 and 67, and PCLK is connected to the gates of the n-channel transistors of transmission gates 61 and 67. The static logic output $Q_{out}$ of interface circuitry 51 is provided at the output of inverter 69.

Transmission gates 61 and 67 pass signals B and B' during the period that PCLK is high. Thus, either B or B' will fall from the precharged logic 1 state to the logic 0 state while the transmission gates 61 and 67 are conducting. When B and B' change from 0 and 1, respectively, through the precharged state of 1 and 1, to 1 and 0, respectively, the final transition of B' from 1 to 0 passes through only one logic gate, namely inverter 69, to cause $Q_{out}$ to change from 0 to 1 as desired. When B and B' transition from 1 and 0, respectively, through the precharged state of 1 and 1, to 0 and 1, respectively, the final 1 to 0 transition or B passes through two logic gates, namely inverters 63 and 69, in order to cause $Q_{out}$ to transition from 1 to 0 as desired. Transmission gates 61 and 67 are disabled upon each falling edge of PCLK, thus causing the desired data to be latched at $Q_{out}$ before B and B' assume the precharged state.

The latching interface 51 of FIG. 6 utilizes the dynamic logic inputs to create a push/pull effect at the output of inverter 63. When B and B' transition from 0 and 1, respectively, through the precharged state of 1 and 1, to 1 and 0, respectively, the falling output of transmission gate 67 begins to pull the output of inverter 63 low while the logic 1 output from transmission gate 61 is also pushing the output of inverter 63 low. This phenomenon enhances the speed of the interface circuitry 51.

If the transistor gate widths in FIG. 6 are: 5 microns for the n-channel and p-channel transistors of transmission gates 61 and 67; 4 microns for the p-channel transistor of inverter 71 and 3 microns for the n-channel transistor of inverter 71; 17 microns for the p-channel transistor of inverter 63 and 5 microns for the n-channel transistor of inverter 63; 3 microns for the p-channel transistor of inverter 65 and 1 micron for the n-channel transistor of inverter 65; and 34.5 microns for the p-channel transistor of inverter 69 and 21 microns for the n-channel transistor of inverter 69; then, with $Q_{out}$ connected to a 0.3 pf load, the average propagation delay is 227 ps, and the average power dissipation is 0.299 mW.

The average propagation delay and the average power dissipation of the circuity of FIG. 6 are 304 ps and 0.237 mW if the transistor gate dimensions are provided as follows: 2.5 micron gate width for the n-channel and p-channel transistors of transmission gates 61 and 67; 4 micron gate width for the p-channel transistor of inverter 63 and a 2.5 micron gate width for the n-channel transistor of inverter 63; a 20 micron gate width for the p-channel transistor of inverter 69 and a 13 micron gate width for the n-channel transistor of inverter 69; a 1.4 micron gate width and a 1.4 micron gate length for both the n-channel transistor and the p-channel transistor of inverter 65; and a 4 micron gate width for the p-channel transistor of inverter 71 and a 3 micron gate width for the n-channel transistor of inverter 71.

Figure 7:
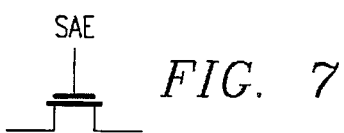
FIG. 7 illustrates an alternative embodiment of the transmission gates of FIG. 6.

As previously indicated, the dynamic signal source 53 of FIG. 5 could be the sense amplifier circuitry of a memory circuit such as an SRAM. If signals B and B' are received from a sense amplifier circuit, then the PCLK input of the embodiment of FIG. 6 would be replaced by the sense amplifier enable (SAE) signal from the sense amplifier circuit, and the FIG. 6 embodiment would otherwise operate as described above. If the signals B and B' are produced by a sense amplifier with a low gain factor, it may be difficult for the B' output of the sense amplifier to pull down the output of inverter 63. If the gain factor of the sense amplifier cannot be increased, the transmission gate 67 (and the transmission gate 61 if desired) can be realized using the alternate transmission gate embodiment of FIG. 7 wherein only an n-channel transistor is used. Using the single n-channel transistor of FIG. 7, the voltage at the output of inverter 63 will be lower than the voltage at B' by a voltage amount approximately equal to the threshold voltage $V_t$ of the n-channel transistor, thus making it easier for B' to pull down the output of inverter 63. If the transmission gates 61 and 67 are realized as shown in FIG. 7, then the inverter 71 is not necessary because only the SAE signal will be needed to control transmission gates 61 and 67.

Figure 8:
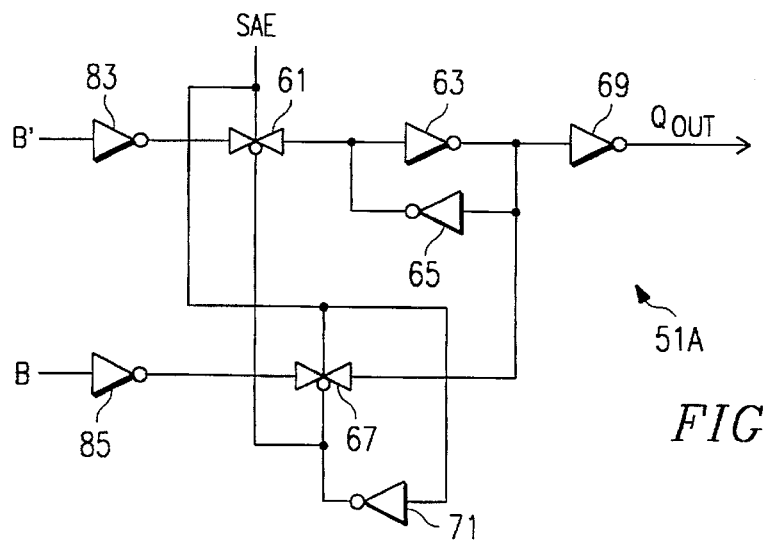
FIG. 8 illustrates another exemplary embodiment of the interface circuitry of FIG. 5.

FIG. 8 illustrates another exemplary embodiment 51A of the interface circuitry of FIG. 5. The alternative embodiment 51A is designed for use with a low gain factor sense amplifier circuit. The gate design of FIG. 8 differs from FIG. 6 in that B and B' as received from the sense amplifier circuit are respectively passed through inverters 85 and 83 whose outputs respectively drive transmission gates 67 and 61. Assuming as above a 0.3 pf load connected to $Q_{out}$ of FIG. 8, an average propagation delay of 376 ps and an average power dissipation of 0.333 mW is obtained using the gate design of FIG. 8 with the following transistor gate dimensions: a 4 micron gate width for the n-channel and p-channel transistors of inverter 63; a 1.4 micron gate width and a 1.0 micron gate length for the n-channel and p-channel transistors of inverter 65; a 17 micron gate width for the p-channel transistor of inverter 69 and a 10 micron gate width for the n-channel transistor of inverter 69; a 2.5 micron gate width for both the n-channel and p-channel transistors of transmission gates 61 and 67; a 5 micron gate width for the p-channel transistors of inverters 83 and 85, and a 4 micron gate width for the n-channel transistors of inverters 83 and 85; a 3 micron gate width for the p-channel transistor of inverter 71 and a 2 micron gate width for the n-channel transistor of inverter 71.

Because the exemplary interface latch circuits of FIGS. 6 and 8 have no stacked transistors as in the prior art, they can utilize smaller transistor sizes than the prior art, and thus present less input capacitance, which advantageously results in lower power dissipation. In fact, the exemplary interface latch circuits of the present invention have less transistor area, lower power dissipation and higher performance than the prior art interface latch circuit of FIG. 2.

Although exemplary embodiments of the present invention are described above, this description does not limit the scope of the invention, which can be practiced in a variety of embodiments.

What is claimed is:

1. A latching circuit for converting a pair of precharged dynamic logic signals into a static logic signal, comprising:

a pair of transmission gates each having an input to receive a respective one of said precharged dynamic logic signals, each said transmission gate having a control input to receive a precharge clock signal associated with said precharged dynamic logic signals, each said transmission gate including an n-channel transistor and a p-channel transistor connected in parallel, and each said transmission gate having an output; and a static logic output to provide said static logic signal, said static logic output coupled to said outputs of said transmission gates.

2. A latching circuit for converting a pair of precharged dynamic logic signals into a static logic signal, comprising:

a first transmission gate having a first input to receive one of said precharged dynamic logic signals, said first transmission gate having a first control input to receive a precharge clock signal associated with said precharged dynamic logic signals, and said first transmission gate having a first output;

a second transmission gate having a second input to receive the other of said precharged dynamic logic signals, said second transmission gate having a second control input to receive said precharge clock signal, and said second transmission gate having a second output;

a pair of cross-coupled inverters, one of said inverters having an input connected to said first output and having an output connected to said second output; and a static logic output to provide said static logic signal, said static logic output coupled to said output of said one inverter.

3. The circuit of claim 2, wherein each of said transmission gates includes an n-channel transistor and a p-channel transistor connected in parallel.

4. The circuit of claim 2, wherein one of said transmission gates is an n-channel transistor.

5. A latching circuit for converting a pair of precharged dynamic logic signals into a static logic signal, comprising:
   a first input to receive one of said dynamic logic signals;
   a second input to receive the other of said dynamic logic signals;
   a static logic output to provide said static logic signal;
   a first signal path from said first input to said static logic output and including only two logic elements; and
   a second signal path from said second input to said static logic output and including only one logic element.

6. The circuit of claim 5, wherein said two logic elements of said first signal path are inverters.

7. The circuit of claim 5, wherein said one logic element of said second signal path is an inverter.

8. An electronic circuit, comprising:
   a dynamic signal source for producing a pair of precharged dynamic logic signals;
   static logic circuitry having an input to receive a static logic signal; and
   a latching interface circuit connected between said dynamic signal source and said static logic circuitry for converting said pair of precharged dynamic logic signals into said static logic signal, said latching interface circuit including a pair of transmission gates each having an input coupled to said dynamic signal source to receive a respective one of said precharged dynamic logic signals, each said transmission gate having a control input to receive a precharge clock signal associated with said precharged dynamic logic signals, each said transmission gate including an n-channel transistor and a p-channel transistor connected in parallel, each said transmission gate having an output, and said latching interface circuit including a static logic output to provide said static logic signal, said static logic output coupled to said outputs of said transmission gates and to said input of said static logic circuitry.

9. The circuit of claim 8, wherein said dynamic signal source is a sense amplifier of a memory circuit and said precharged dynamic logic signals represent a data bit from the memory circuit.

10. The circuit of claim 8, including a pair of inverters connected between said dynamic signal source and said latching interface circuit for providing said pair of precharged dynamic logic signals to said latching interface circuit.

11. An electronic circuit, comprising:
    a dynamic signal source for producing a pair of precharged dynamic logic signals;
    static logic circuitry having an input to receive a static logic signal; and
    a latching interface circuit connected between said dynamic signal source and said static logic circuitry for converting said pair of precharged dynamic logic signals into said static logic signal;
    said latching interface circuit including a first transmission gate having a first input to receive one of said precharged dynamic logic signals and having a first control input to receive a precharge clock signal associated with said precharged dynamic logic signals and having a first output, a second transmission gate having a second input to receive the other of said precharged dynamic logic signals and having a second control input to receive said precharge clock signal and having a second output, a pair of cross-coupled inverters, one said inverter having an input connected to said first output and having an output connected to said second output, and a static logic output to provide said static logic signal, said static logic output coupled to said output of said one inverter and to said input of said static logic circuitry.

12. The circuit of claim 11, wherein said dynamic signal source is a sense amplifier of a memory circuit and said precharged dynamic logic signals represent a data bit from the memory circuit.

13. The circuit of claim 11, including a pair of inverters connected between said dynamic signal source and said latching interface circuit for providing said pair of precharged dynamic logic signals to said latching interface circuit.

14. The circuit of claim 11, wherein each of said transmission gates includes an n-channel transistor and a p-channel transistor connected in parallel.

15. The circuit of claim 11, wherein one of said transmission gates is an n-channel transistor.

16. An electronic circuit, comprising:
    a dynamic signal source for producing a pair of precharged dynamic logic signals;
    static logic circuitry having an input to receive a static logic signal; and
    a latching interface circuit connected between said dynamic signal source and said static logic circuitry for converting said pair of precharged dynamic logic signals into said static logic signal;
    said latching interface circuit including a first input to receive one of said dynamic logic signals, a second input to receive the other of said dynamic logic signals, a static logic output coupled to said input of said static logic circuitry to provide said static logic signal, a first signal path from said first input to said static logic output and including only two logic elements, and a second signal path from said second input to said static logic output and including only one logic element.

17. The circuit of claim 16, wherein said two logic elements of said first signal path are inverters.

18. The circuit of claim 16, wherein said one logic element of said second signal path is an inverter.

19. The circuit of claim 16, wherein said dynamic signal source is a sense amplifier of a memory circuit and said precharged dynamic logic signals represent a data bit from the memory circuit.

20. The circuit of claim 16, including a pair of inverters connected between said dynamic signal source and said latching interface circuit for providing said pair of precharged dynamic logic signals to said latching interface circuit.

21. The circuit of claim 2, including a single logic element coupling said output of said one inverter to said static logic output.

22. The circuit of claim 21, wherein said logic element is an inverter.

* * * * *